(12) United States Patent
Huegler et al.

(10) Patent No.: US 11,493,555 B2
(45) Date of Patent: Nov. 8, 2022

(54) METHOD FOR IDENTIFYING A FAULT IN A ROTOR OF AN ELECTRIC MOTOR AND CONTROLLER

(71) Applicant: Bayerische Motoren Werke Aktiengesellschaft, Munich (DE)

(72) Inventors: Sebastian Huegler, Munich (DE); Jovan Knezevic, Munich (DE); Roman Nestlinger, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 17/398,703

(22) Filed: Aug. 10, 2021

(65) Prior Publication Data

US 2022/0082624 A1 Mar. 17, 2022

(30) Foreign Application Priority Data

Sep. 15, 2020 (DE) ...................... 10 2020 123 957.2

(51) Int. Cl.
*H02P 29/024* (2016.01)
*G01R 31/34* (2020.01)

(52) U.S. Cl.
CPC .......... *G01R 31/343* (2013.01); *H02P 29/024* (2013.01)

(58) Field of Classification Search
CPC . G01R 31/343; G01R 31/346; H02P 2207/05; H02P 29/024
See application file for complete search history.

(56) References Cited

U.S. PATENT DOCUMENTS

| 5,469,032 A * | 11/1995 | Otake ................... B60L 3/0038 |
| | | 361/23 |
| 2011/0234181 A1* | 9/2011 | Hobelsberger .......... H02P 29/00 |
| | | 322/99 |
| 2012/0265457 A1 | 10/2012 | Donolo |
| 2017/0082692 A1* | 3/2017 | Mulay .................... G01R 33/04 |

FOREIGN PATENT DOCUMENTS

DE   10 2008 043 103 A1   4/2010

OTHER PUBLICATIONS

German-language Search Report issued in German Application No. 10 2020 123 957.2 dated May 20, 2021 with partial English translation (10 pages).

\* cited by examiner

*Primary Examiner* — Natalie Huls
*Assistant Examiner* — Sharad Timilsina
(74) *Attorney, Agent, or Firm* — Crowell & Moring LLP

(57) ABSTRACT

A method for operating a separately excited electric motor, which includes a rotor and a stator, includes the following: determining an electrical characteristic variable of the rotor and an electrical characteristic variable of the stator, calculating an initial setpoint voltage value for the stator based on a setpoint current value, a measured current value, and the determined electrical characteristic variables of the rotor and the stator, checking, based on the calculated initial setpoint voltage value, whether there is an electrical fault, in particular a shorted coil, at the rotor, and providing a fault message and/or disconnecting the electric motor if a fault has been identified.

13 Claims, 1 Drawing Sheet

METHOD FOR IDENTIFYING A FAULT IN A ROTOR OF AN ELECTRIC MOTOR AND CONTROLLER

CROSS REFERENCE TO RELATED APPLICATION

This application claims priority under 35 U.S.C. § 119 from German Patent Application No. DE 10 2020 123 957.2, filed Sep. 15, 2020, the entire disclosure of which is herein expressly incorporated by reference.

BACKGROUND AND SUMMARY OF THE INVENTION

The invention relates to a method for identifying a fault in a rotor of an electric motor and to a controller for an electric motor.

Electric motors are used, for example, in vehicles for the drive in order to convert electrical energy into propulsion. For this purpose a rotating magnetic field is generated at a stator of the electric motor, with the result that the magnetic rotor of the electric motor rotates in the magnetic field of the stator. The torque provided by the electric motor and the power of the motor are in this case dependent on the rotational speed of the rotor and thus on the magnetic field that is applied to the stator.

Field-oriented control processes for actuating electric motors are known from the prior art.

In the case of separately excited electric motors, that is to say in electric motors that have an electromagnet such as a coil through which current flows as rotor, electrical faults can arise at the rotor, for example a shorted coil. These electrical faults influence the torque generated by the electric motor.

Furthermore, the magnetization of the permanent magnets in the case of permanently excited electric motors can reduce over time.

Such faults currently cannot be identified or can be identified only with a great degree of outlay.

It is therefore the object of the invention to provide a method and a controller that identify the occurrence of such a fault in a simple manner.

The object is achieved by a method for identifying a fault in a rotor of an electric motor, which comprises a stator, by the following acts:
a) determining a characteristic variable of the rotor and an electrical characteristic variable of the stator,
b) measuring a current value of the electric motor,
c) calculating an initial setpoint voltage value for the stator based on a setpoint current value, the measured current value and the determined characteristic variables of the rotor and the stator,
d) checking, based on the calculated initial setpoint voltage value, whether there is a fault, in particular a shorted coil, at the rotor, and
e) operating the electric motor based on the setpoint voltage value by way of the controller if no fault has been identified in act d), or
f) providing a fault message by way of the controller and/or disconnecting the electric motor by way of the controller if a fault has been identified in act d).

The invention is based on the basic idea of being able to identify a fault at the rotor on account of the electromagnetic coupling between the rotor and the stator by virtue of the voltage values of the stator being evaluated. For this, the controller calculates an initial setpoint voltage value at the stator and adjusts this setpoint voltage value by way of corresponding current control at the stator. If the controller has to readjust the setpoint voltage value to a very great extent, that is to say above a threshold value, the controller identifies that there is a fault at the rotor and provides a corresponding fault message and/or disconnects the electric motor. A simple option for identifying a fault at the rotor is provided in this way.

In this case, the controller identifies, in particular, an electrical fault in a separately excited electric motor, for example a shorted coil in the rotor of a synchronous machine or a breakage of a rod of a squirrel-cage rotor of an asynchronous machine.

As an alternative, the controller can identify a magnetic fault in a permanently excited electric motor, for example a decreasing magnetization of the magnets of the rotor.

Determining a characteristic variable is understood according to embodiments of the invention to mean that the characteristic variable is read out from a memory, calculated or measured and provided to the controller.

The characteristic variable of the rotor can be an electrical or a magnetic characteristic variable. The controller can determine the initial setpoint voltage value based on a mathematical model. This makes it possible to determine the setpoint voltage value precisely.

One aspect of the invention makes provision for the controller to identify the fault based on an increased voltage control value compared with the fault-free operation of the electric motor. This makes it possible to determine the electrical fault reliably.

The controller can verify or falsify a presence of the fault by changing the initial setpoint voltage value. This prevents the controller from disconnecting the electric motor and/or from providing a fault message even though there is no fault at the rotor.

In this case, the change of the initial setpoint voltage value if the controller falsifies the electrical fault can lead to a modified setpoint voltage value, based on which the electric motor is actuated.

For example, the controller increases or decreases the initial setpoint voltage value and thereby obtains the modified setpoint voltage value.

In one configuration of the invention, the controller determines in a rotor-fixed coordinate system two setpoint voltage values for the stator and, based on an increased voltage control value for one of the two setpoint voltage values, verifies the fault. Therefore, no additional sensor system or diagnostics system is necessary to check for the presence of the fault.

It is conceivable that the controller verifies the presence of the fault of the rotor if one of the two voltage control values still has an increased value due to the change of the setpoint voltage values.

Furthermore, the presence of the fault can be falsified if both voltage control values have an increased value due to the change of the setpoint voltage values. In this way, the controller can distinguish between a fault of the coordinate system (incorrect position of the rotor) and an actual electrical fault at the rotor.

A further aspect of the invention makes provision for the controller to provide the fault message and/or disconnect the electric motor only in the case of a verified fault. Confusion over the presence of an electrical fault is therefore prevented by the controller.

As an alternative or in addition, provision can be made for the controller to operate the electric motor using the calculated setpoint voltage value if the identified fault has been falsified by the controller. This prevents unnecessary disconnection of the electric motor.

The controller can determine at least an inductance and/or a resistance as electrical characteristic variable of the rotor and the stator. In this way, the controller can determine the setpoint voltage values based on a mathematical model.

In general, it is also conceivable for the controller to determine a magnetic energy density of the rotor.

In one configuration of the invention, the electric motor is a separately excited three-phase machine, in particular a separately excited three-phase synchronous machine, which is controlled by the controller. In this case, the controller measures in particular at least four current values, that is to say three current values of the coils of the stator and one current value of the coil of the rotor.

As an alternative, the electric motor can also be a permanently excited three-phase synchronous machine or a three-phase asynchronous machine.

In order to provide a specific torque at the electric motor, the controller can additionally determine the setpoint voltage value based on a torque demand and/or a measured angular velocity of the rotor.

The object of the invention is furthermore achieved by a controller for an electric motor, wherein the controller is designed to execute a previously described method. For the features and advantages of the controller, reference is made to the above statements regarding the method.

It is conceivable that the controller and the electric motor are part of a vehicle.

For example, the vehicle is an electric vehicle, with the result that the electric motor actuated by the controller is the only drive motor of the vehicle.

As an alternative, the vehicle can also be a hybrid electric vehicle, according to which the propulsion of the vehicle is generated by the electric motor and an additional internal combustion engine.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
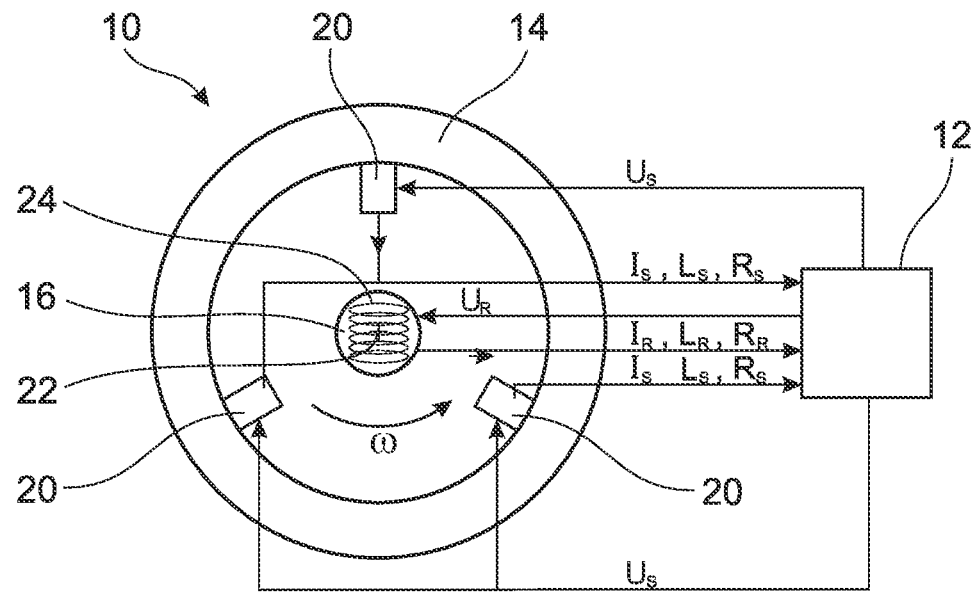
FIG. 1 shows a schematic side view of an electric motor and a controller according to embodiments of the invention.

FIG. 1 shows an electric motor 10 and a controller 12 connected electronically to the electric motor 10.

For example, the electric motor 10 and the controller 12 are provided in a vehicle, in particular a motor vehicle.

In this case, the electric motor 10 is designed as a separately excited three-phase synchronous machine, wherein the electric motor 10 comprises a stator 14 and a rotor 16.

The stator 14 surrounds the rotor 16 and, in the embodiment of FIG. 1, has three electromagnets 20, for example 3 coils. Another number of electromagnets 20 is of course also conceivable.

The three electromagnets 20 are arranged offset from one another at an angle of 120°, that is to say at equal angular spacings from one another, and each generate a magnetic field if a voltage with a corresponding voltage value $U_S$ is applied to the respective electromagnet 20. In this case, a current with a current value $I_S$ flows through the electromagnets 20.

The rotor 16 is arranged so as to be able to rotate about an axis of rotation 22. The rotor 16 can comprise an electromagnet 24, for example a coil, through which current flows and which interacts with the electromagnets 20 of the stator 14. In FIG. 1, the electromagnet 24 is indicated by coil windings.

The controller 12 is connected electronically to the electromagnets 20, 24 of the stator 14 and the rotor 16 and designed to apply a corresponding voltage value $U_S$, $U_R$ in each case to the electromagnets 20, 24 and to determine from the electromagnets 20, 24 in each case a resistance $R_S$, $R_R$, an inductance $L_S$, $L_R$ and a current value $I_S$, $I_R$, which flows through the electromagnets 20, 24.

If the electromagnets 20 of the stator 14 generate a magnetic rotating field and a corresponding current flows through the electromagnet 24 of the rotor 16, the rotor 16 rotates about the axis of rotation 22 at an angular velocity ω. More precisely, the controller 12 uses a method to control the energization of the electromagnets 20, 24 accordingly. This method is schematically shown in the block diagram of FIG. 2.

In a first method step (S1), the controller 12 determines an electrical characteristic variable of the stator 14 and an electrical characteristic variable of the rotor 16.

For example, the inductances $L_S$ and the resistances $R_S$ of the electromagnets 20 of the stator 14 and accordingly also the resistance $R_R$ and the inductance $L_R$ of the electromagnet 24 (coil) of the rotor 16, which have been (previously) measured by at least one sensor, are provided to the controller 12.

It is also conceivable for the inductances $L_S$, $L_R$ and the resistances $R_S$, $R_R$ to also be stored in a data memory, such as a read-only memory or a random-access memory of the controller 12 and for the controller 12 to read out the corresponding values from the data memory.

In this case, the resistances $R_S$ and inductances $L_S$ of each electromagnet 20 of the stator 14 do not necessarily have to be identical. For the sake of simplicity, the resistances $R_S$ and inductances $L_S$ of the stator 14 are characterized by only one reference sign.

Subsequently (method step S2), the current values $I_S$ of the stator 14 and the current value $I_R$ of the rotor 16 as well as the angular velocity ω of the rotor 16 are measured, for example by way of a Hall sensor. The corresponding values are provided to the controller 12.

Here, too, it is pointed out that the maximum values of the current values $I_S$ that are measured at each electromagnet 20 do not necessarily have to be identical.

In particular, the profile of the current values $I_S$ applied to the corresponding electromagnet 20 is shifted in each case by 120° with respect to another, that is to say correspondingly phase-shifted.

In a next method step (S3), the controller 12 receives a torque demand D and transforms the variables received and determined to a rotor-fixed coordinate system with the axes d and q by way of a Park transformation.

Subsequently, in step S4, the controller 12 determines an initial setpoint voltage value $U_S$ for the stator 14, that is to say the electromagnets 20, based on the electrical characteristic variables $R_S$, $L_S$ of the stator 14, the electrical characteristic variables $R_R$, $L_R$ of the rotor 16, setpoint current values $I_S^*$, $I_R^*$ of the stator 14 and the rotor 16, which result from the torque demand D, and the angular velocity ω of the rotor 16.

For this purpose, the controller 12 uses a mathematical model, which comprises the following equations:

$$U_d = R_1 I_d^* + \frac{d}{dt}\psi_d - \omega\,\psi_q, \quad (1)$$

$$U_q = R_1 I_q^* + \frac{d}{dt}\psi_q + \omega\,\psi_d, \text{ and} \quad (2)$$

$$U_R = R_R I_R^* + \frac{d}{dt}\psi_R. \quad (3)$$

In the equations, $U_d$, $U_q$ are the initial setpoint voltage values for the stator 14 and $I_q^*$, $I_d^*$ the setpoint current values of the stator 14 in the d-q coordinate system, $I_R^*$ the setpoint voltage value of the rotor 16, $R_1$ the combined resistance of the electromagnets 20 of the stator 14 and $\psi_d$, $\psi_q$, $\psi_R$ are the magnetic linked fluxes, which are determined by the following equations:

$$\psi_d = L_{dR} I_R^* + L_d I_d^*, \quad (4)$$

$$\psi_q = L_q I_q^*, \text{ and} \quad (5)$$

$$\psi_R = L_{Rd} I_d^* + L_R I_R^*. \quad (6)$$

In this case, $L_d$, $L_q$ are the inductances of the stator 14 that are transformed to the d-q coordinate system and the inductances $L_{dR}$, $L_{Rd}$ are the coupling inductances between the electromagnets 20 of the stator 14 and the electromagnet 24 of the rotor 16.

In a next method step, the controller 12 controls the voltages $U_S$ applied to the stator 14 using field-oriented control.

For this purpose, the controller 12 uses the measured current values $I_S$, $I_R$ of the stator 14 and the rotor 16 and accordingly corrects the initial setpoint voltage values $U_S$ at the electromagnets 20 of the stator 14.

In this case, the derivations of the linked fluxes are set to be equal to 0 and accordingly produce the following control equations for the controller 12:

$$U_d = U_{d,R} + R_1 I_d - \omega\psi_q, \quad (7)$$

$$U_q = U_{q,R} + R_1 I_q + \omega\psi_d, \text{ and} \quad (8)$$

$$U_R = U_{R,R} + R_R I_R. \quad (9)$$

The variables $U_d$, $U_q$ and $U_R$ have been determined in this case by way of the mathematical model and the controller 12 adapts the setpoint voltage values $U_d$, $U_q$ of the stator 14 by correspondingly adapting the voltage control values $U_{d,R}$ and $U_{q,R}$. Furthermore, the setpoint voltage value $U_R$ of the rotor 16 is adapted by adapting the voltage control value $U_{R,R}$.

Fault-free operation of the electric motor 10 results in $U_{d,R} \approx U_{R,R} \approx U_{q,R} \approx 0$. The controller 12 thus has to intervene only a little in the fault-free operation of the electric motor 10.

Based on this control, the controller 12 checks in step S6 whether there is an electrical fault F at the rotor 16. In this case, the controller 12 identifies the presence of the electrical fault F based on an increased voltage control value $U_{q,R}$. The controller 12 thus has to intervene to a great extent in order to achieve the setpoint voltage value $U_S$, that is to say the voltage values $U_d$ and $U_q$ of the mathematical model.

Figure 2:
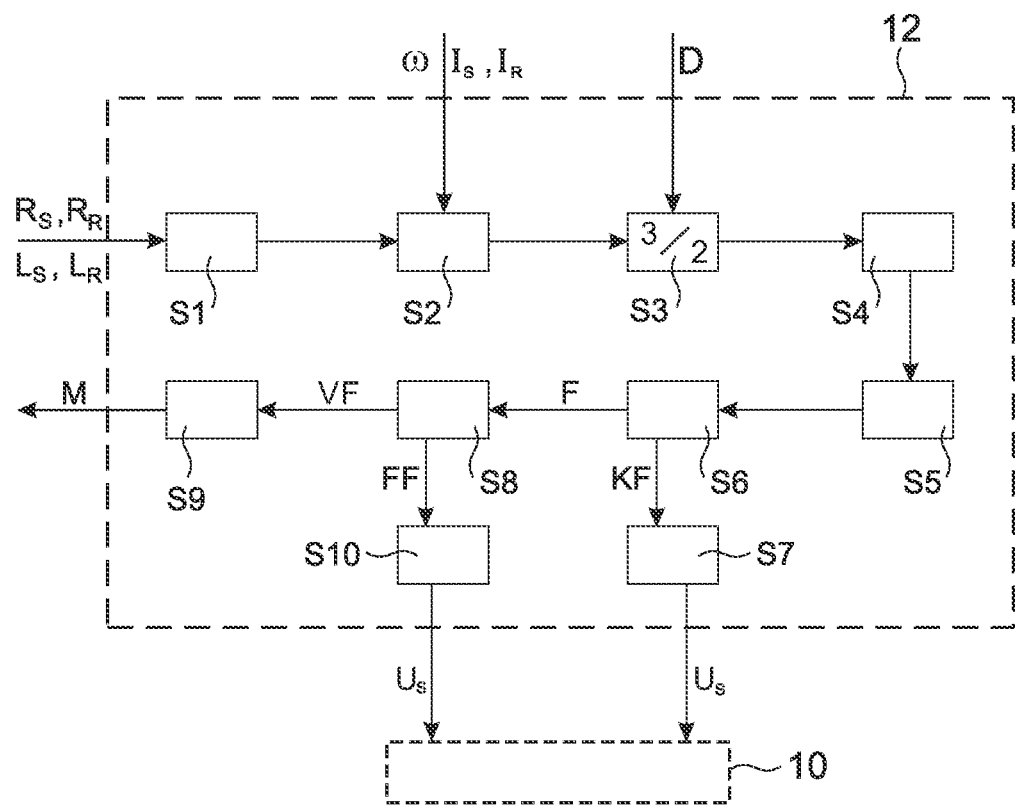
FIG. 2 shows a schematic block diagram of a method according to embodiments of the invention.

Depending on the result of this check, the controller 12 behaves differently (this is shown by the two arrows in the block diagram of FIG. 2, which extend away from the box of step S6).

If there is no electrical fault KF, the controller 12 operates the electric motor 10 based on the calculated initial setpoint voltage value $U_S$ (step S7). This is illustrated in FIG. 2 by a corresponding arrow to the electric motor 10.

In the other case (the controller 12 identifies an electrical fault F), the controller 12 checks whether there is actually an electrical fault (step S8).

In other words, the controller 12 verifies or falsifies the presence of the electrical fault F.

For this purpose, the controller 12 varies the voltage values $U_S$ applied to the stator 14.

The controller 12 thus varies the current values $I_S$ applied to the stator 14. For example, the controller 12 controls the current values $I_S$ of the stator 14 in such a way that they are equal to 0, and applies a current value $I_R$ not equal to zero to the rotor 16.

If the controller 12 then still has to provide an increased voltage control value $U_{q,R}$, there is a verified electrical fault VF and the controller 12 provides in step S9 a corresponding fault message M and/or disconnects the electric motor 10.

If the controller 12 has to control both voltage control values $U_{q,R}$ and $U_{d,R}$ to a great extent, there is a fault in the position of the rotor 16. The controller 12 therefore identifies a falsified electrical fault FF. In this case, the controller 12 corrects the position of the rotor 16 and then operates the electric motor 10 using the initial setpoint voltage value $U_S$.

Simple identification of an electrical fault F at the rotor 16 is thus made possible by the controller 12 and the described method. In this case, the presence of an electrical fault F has an impact on the electromagnets 20 of the stator 14 by way of the electromagnetic interaction between the rotor 16 and the stator 14.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for identifying a fault in a rotor of an electric motor comprising a stator, the method comprising:
   determining a characteristic variable of the rotor and an electrical characteristic variable of the stator,
   measuring a current value of the electric motor,
   calculating an initial setpoint voltage value for the stator based on a setpoint current value, the measured current value, the determined characteristic variable of the rotor, and the determined electrical characteristic variable of the stator,
   checking, based on a calculated initial setpoint voltage value, whether there is a fault at the rotor, and
   operating the electric motor based on the initial setpoint voltage value by way of the controller if no fault has been identified, or
   at least one of: providing a fault message by way of the controller or disconnecting the electric motor by way of the controller if the fault has been identified.

2. The method according to claim 1, wherein the fault is a shorted coil.

3. The method according to claim 2, wherein the controller identifies the fault based on an increased voltage control value compared with fault-free operation of the electric motor.

4. The method according to claim 1, wherein the controller verifies or falsifies a presence of the fault by changing the initial setpoint voltage value.

5. The method according to claim 1, wherein the controller determines in a rotor-fixed coordinate system two setpoint voltage values for the stator and, based on an increased voltage control value for one of the two setpoint voltage values, verifies the fault.

6. The method according to claim 5, wherein the controller verifies the presence of the fault of the rotor if, by changing the setpoint voltage values, one of the two voltage control values still has an increased value and falsifies the presence of the fault if, by changing the setpoint voltage values, both voltage control values have an increased value.

7. The method according to claim 4, wherein the controller at least one of provides the fault message or disconnects the electric motor only upon a verified fault.

8. The method according to claim 7, wherein the controller operates the electric motor using the calculated setpoint value voltage if the identified fault has been falsified by way of the controller.

9. The method according to claim 1, wherein the controller determines at least one of an inductance or a resistance as the characteristic variable of the rotor and the electrical characteristic variable of the stator.

10. The method according to claim 1, wherein the electric motor is a separately excited three-phase machine which is controlled by the controller.

11. The method according to claim 10, wherein the electric motor is a separately excited three-phase synchronous machine.

12. The method according to claim 1, wherein the controller additionally determines the setpoint voltage value based on at least one of a torque demand or a measured angular velocity of the rotor.

13. A controller for an electric motor, wherein the controller is configured to perform the method according to claim 1.

* * * * *